(12) United States Patent
Tsai

(10) Patent No.: US 8,416,110 B2
(45) Date of Patent: Apr. 9, 2013

(54) MULTI-CHANNEL ANALOG DIGITAL CONVERSION CIRCUIT AND ANALOG DIGITAL CONVERSION METHOD THEREOF

(75) Inventor: Chun-An Tsai, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 126 days.

(21) Appl. No.: 13/027,213

(22) Filed: Feb. 14, 2011

(65) Prior Publication Data

US 2011/0199245 A1  Aug. 18, 2011

(30) Foreign Application Priority Data

Feb. 12, 2010  (TW) .............................. 99104755 A

(51) Int. Cl.
*H03M 1/00*  (2006.01)
*H03M 1/12*  (2006.01)
(52) U.S. Cl.
USPC ............................ 341/141; 341/122; 341/155
(58) Field of Classification Search ............... 341/122, 341/141, 155
See application file for complete search history.

(56) References Cited

U.S. PATENT DOCUMENTS

| 4,677,422 | A | * | 6/1987 | Naito | 341/122 |
| 6,094,153 | A | * | 7/2000 | Rumsey et al. | 341/155 |
| 6,597,299 | B1 | * | 7/2003 | Bugeja | 341/122 |
| 7,307,572 | B2 | * | 12/2007 | Garrity et al. | 341/172 |
| 7,400,283 | B1 | * | 7/2008 | Zhu | 341/141 |
| 7,411,533 | B2 | * | 8/2008 | Posamentier | 341/122 |
| 7,439,889 | B2 | * | 10/2008 | Fujimoto | 341/143 |
| 7,705,756 | B2 | * | 4/2010 | Harper | 341/141 |
| 7,932,846 | B2 | * | 4/2011 | Imai | 341/155 |
| 2008/0074521 | A1 | | 3/2008 | Olsen | |

FOREIGN PATENT DOCUMENTS

| CN | 1049067 A | 2/1991 |
| CN | 101364447 A | 2/2009 |
| CN | 101504868 A | 8/2009 |
| TW | 200935761 A | 8/2009 |

\* cited by examiner

*Primary Examiner* — Khai M Nguyen
(74) *Attorney, Agent, or Firm* — Rabin & Berdo, P.C.

(57) ABSTRACT

A multi-channel analog digital conversion circuit includes a plurality of sampling circuits for sampling and buffering a plurality of analog input signals, a single output circuit coupled to the sampling circuits and shared by the sampling circuits and a single analog digital conversion core coupled to the output circuit and shared by the sampling circuits.

9 Claims, 6 Drawing Sheets

MULTI-CHANNEL ANALOG DIGITAL CONVERSION CIRCUIT AND ANALOG DIGITAL CONVERSION METHOD THEREOF

This application claims the benefit of Taiwan application Serial No. 99104755, filed Feb. 12, 2010, the subject matter of which is incorporated herein by reference.

TECHNICAL FIELD

The disclosure relates in general to a multi-channel analog digital conversion circuit and an analog digital conversion method thereof, and more particularly to a multi-channel analog digital conversion circuit sharing an analog digital conversion core and an analog digital conversion method thereof.

BACKGROUND

Application of the analog digital conversion circuit has become wider and wider. The analog digital conversion circuit can be applied in multi-channel/multi-input/multi-output. However, as for the conventional analog digital conversion circuit, in N channels situation, N analog digital conversion circuits will be needed (N being a positive integer). As the circuit area increases, more circuit costs will occur.

Thus, it is a prominent task for the industries to provide an analog digital conversion circuit, which does not increase circuit area or circuit cost significantly when used in multi-channel/multi-input/multi-output.

BRIEF SUMMARY

The disclosure is directed to an analog digital conversion circuit and a method thereof. When the analog digital conversion circuit and the method thereof are used in multi-channel/multi-input/multi-output, a back-stage analog digital conversion core and a back-stage output circuit can be shared by multiple front-stage sampling circuits, hence reducing the circuit area and/or the circuit cost.

According to a first example of the present disclosure, a multi-channel analog digital conversion circuit is disclosed. The multi-channel analog digital conversion circuit includes a plurality of sampling circuits for sampling and buffering a plurality groups of analog input signals, a single output circuit coupled to the sampling circuits and shared by the sampling circuits and a single analog digital conversion core coupled to the output circuit and shared by the sampling circuits.

According to a second example of the present disclosure, a multi-channel analog digital conversion circuit is disclosed. The multi-channel analog digital conversion circuit includes a plurality of sampling circuits for sampling and buffering a plurality groups of analog input signals, a single output circuit coupled to the sampling circuits and shared by the sampling circuits and a single analog digital conversion core coupled to the output circuit and shared by the sampling circuits. The sampling circuits sequentially transmit the sampled groups of the analog input signals to the output circuit. The output circuit further sequentially transmits the groups of the analog input signals to the analog digital conversion core which sequentially converts the groups of the analog input signals into a plurality of digital output signals.

According to a third example of the present disclosure, an analog digital conversion method for a multi-channel analog digital conversion circuit is disclosed. The analog digital conversion method includes: concurrently sampling and buffering a plurality groups of analog input signals; sequentially performing analog digital conversion to the sampled groups of the analog input signals for sequentially outputting a plurality of digital output signals; avoiding affecting the sampled-but-unconverted group of the analog input signals; and coupling a common voltage to the converted group of the analog input signals.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE PRESENT DISCLOSURE

When an analog digital conversion circuit disclosed in embodiments of the disclosure is used in multi-channel/multi-input/multi-output, a back-stage analog digital conversion core and a back-stage output circuit can be shared by multiple front-stage sampling circuits, so that the circuit area and the circuit cost are reduced.

A number of embodiments are disclosed below for elaborating the architecture and the principles of operation of the analog digital conversion circuit of the embodiments of the disclosure when used in 2, 3 and 4 channels.

First Embodiment: 2 Channels

Figure 1:
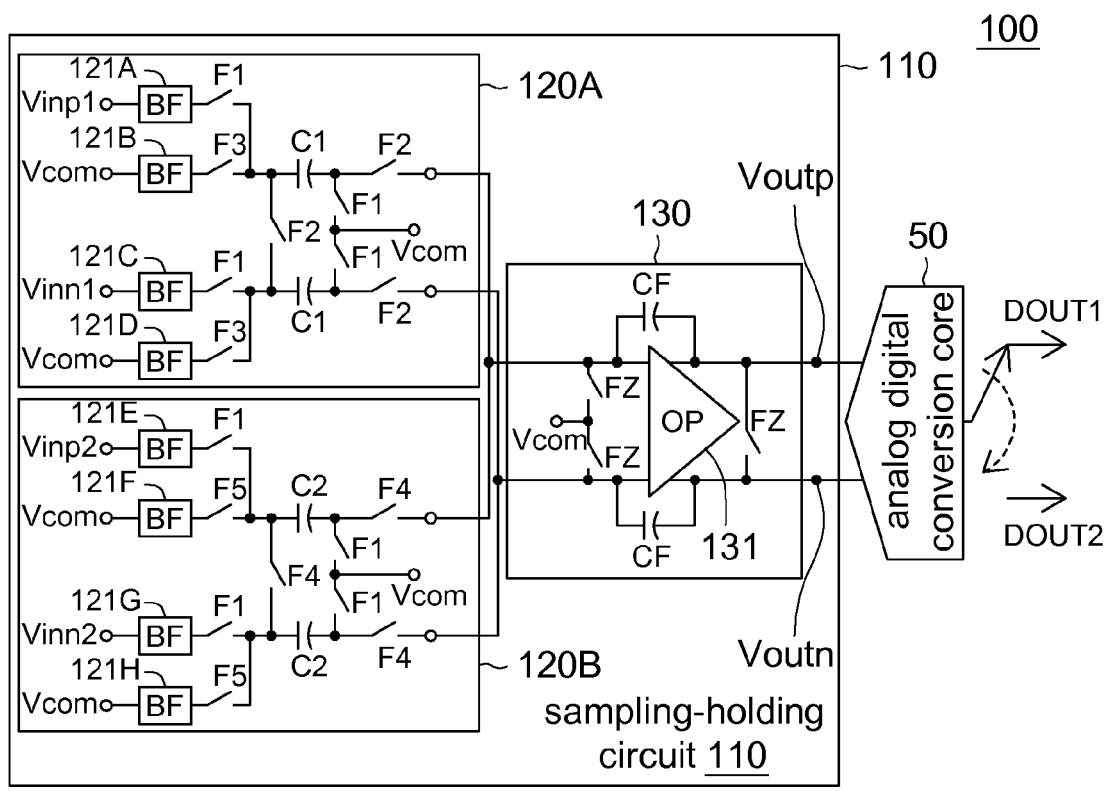
FIG. 1 shows an analog digital conversion circuit according to a first embodiment of the disclosure.
Figure 2:
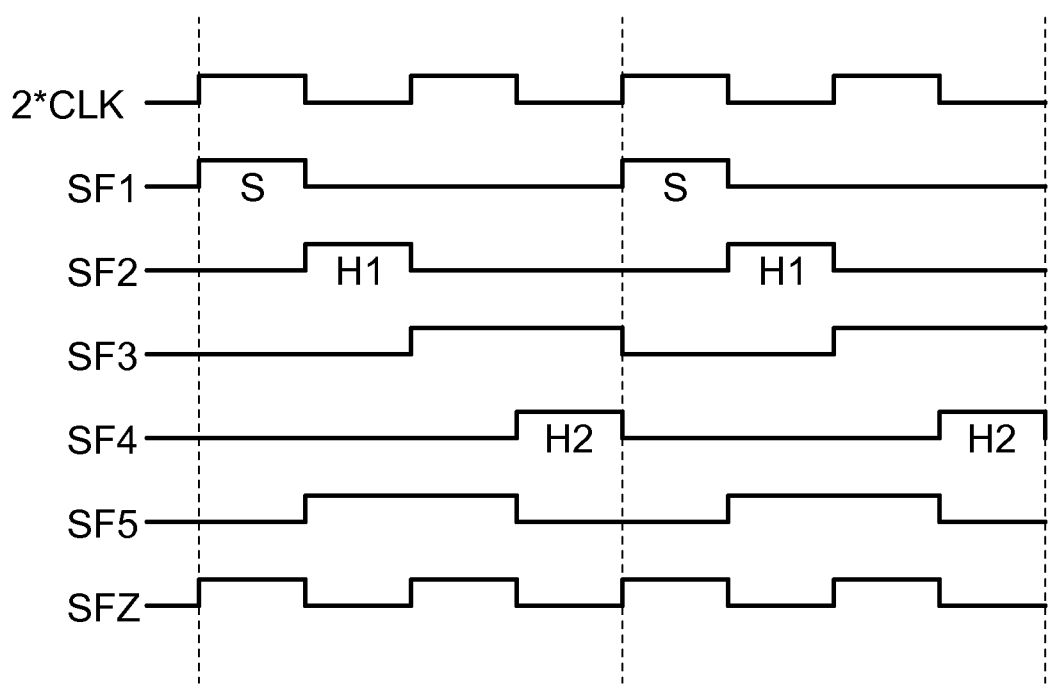
FIG. 2 shows a signal waveform of the analog digital conversion circuit according to the first embodiment of the disclosure.

FIG. 1 shows an analog digital conversion circuit according to a first embodiment of the disclosure. FIG. 2 shows a signal waveform of the analog digital conversion circuit according to the first embodiment of the disclosure. The analog digital conversion circuit of the first embodiment of the disclosure is applied in for example 2 channels. That is, the analog digital conversion circuit of the first embodiment of the disclosure can receive and convert 2 groups of analog input signals into 2 digital output signals. In the description of the disclosure, "1 channel" refers to receiving and converting 1 group of analog input signals into 1 digital output signal.

As indicated in FIG. 1, the analog digital conversion circuit 100 of the first embodiment of the disclosure includes a sampling-holding circuit 110 and an analog digital conversion core 50. The analog digital conversion core 50 converts a group of analog signals into a digital signal. The sampling-holding circuit 110 includes multiple sampling circuits 120A and 120B, and an output circuit 130. The number of sampling circuits basically corresponds to (equal to) the number of channels.

The sampling circuit 120A includes a plurality of buffer circuits (BF) 121A~121D, multiple switches F1, multiple switches F2, multiple switches F3 and multiple capacitors C1. The buffer circuits 121A and 121C respectively buffer the analog input signals Vinp1 and Vinn1. The buffer circuits 121B and 121D both buffer the common voltage Vcom.

The first of the switches F1 is coupled between the buffer circuit 121A and the capacitor C1 (above). That is, the ON/OFF status of the first of the switches F1 determines whether the analog input signal Vinp1 buffered in the buffer circuit 121A can be coupled to the capacitor C1 (above). The second of the switches F1 is coupled between the buffer circuit 121C and the capacitor C1 (below). That is, the ON/OFF status of the second of the switches F1 determines whether the analog input signal Vinn1 buffered in the buffer circuit 121C can be coupled to the capacitor C1 (below). The third of the switches F1 is coupled between the capacitor C1 (above) and the common voltage Vcom. That is, the ON/OFF status of the third of the switches F1 determines whether the common voltage Vcom can be coupled to the capacitor C1 (above). The fourth of the switches F1 is coupled between the capacitor C1 (below) and the common voltage Vcom. That is, the ON/OFF status of the fourth of the switches F1 determines whether the common voltage Vcom can be coupled to the capacitor C1 (below).

The first of the switches F2 is coupled between two capacitors C1. That is, the ON/OFF status of the first of the switches F2 determines whether charges will be shared between two capacitors C1. The second of the switches F2 is coupled between the capacitor C1 (above) and the output circuit 130. That is, the ON/OFF status of the second of the switches F2 determines whether the charges stored in the capacitor C1 (above) will be transmitted to the output circuit 130. The third of the switches F2 is coupled between the capacitor C1 (below) and the output circuit 130. That is, the ON/OFF status of the third of the switches F2 determines whether the charges stored in the capacitor C1 (below) will be transmitted to the output circuit 130.

The first of the switches F3 is coupled between the buffer circuit 121B and the capacitor C1 (above). That is, the ON/OFF status of the first of the switches F3 determines whether the common voltage Vcom buffered in the buffer circuit 121B can be coupled to the capacitor C1 (above). The second of the switches F3 is coupled between the buffer circuit 121D and the capacitor C1 (below). That is, the ON/OFF status of the second of the switches F3 determines whether the common voltage Vcom buffered in the buffer circuit 121D can be coupled to the capacitor C1 (below).

The sampling circuit 120B includes buffer circuits 121E~121H, multiple switches F1, multiple switches F4, multiple switches F5 and multiple capacitors C2. functions and operations of the elements of the sampling circuit 120B are similar to that of the sampling circuit 120A, and the similarities are not repeated here.

The output circuit 130 includes an operating amplifier (OP) 131, multiple switches FZ and multiple capacitors CF. The first of the multiple switches FZ is coupled between the common voltage Vcom and a first output end of the operating amplifier. That is, the ON/OFF status of the first of the switches FZ determines whether the common voltage Vcom can be coupled to the first output end of the operating amplifier. The second of the multiple switches FZ is coupled between the common voltage Vcom and a second output end of the operating amplifier. That is, the ON/OFF status of the second of the switches FZ determines whether the common voltage Vcom can be coupled to the second output end of the operating amplifier. The third of the multiple switches FZ is coupled between two output ends of the operating amplifier. That is, the ON/OFF status of the third of the switches FZ determines whether the output voltages (Voutp and Voutn) at the two output ends of the operating amplifier are equal.

Referring to both FIG. 1 and FIG. 2, the principles of operation of the first embodiment of the disclosure are disclosed. The operating clock 2*CLK will be inputted to the buffer circuits 121A~121H, the operating amplifier 131 of the output circuit 130 and the analog digital conversion core 50, which are all inside the analog digital conversion circuit 100. The control signals SF1, SF2, SF3, SF4, SF5 and SFZ of FIG. 2 respectively control the switches F1, F2, F3, F4, F5 and FZ. In the present embodiment of the disclosure, the switch will be turned on when the control signal is logic high. To the contrary, the switch will be turned off when the control signal is logic low. The control signal can be generated by a controller (not illustrated) according to the operating clock 2*CLK.

Within a sampling period (designated as S in FIG. 2), the switches F1 are ON, so that the 2 groups of analog input signals buffered in the buffer circuit 121A, 121C, 121E and 121G respectively charge the capacitors C1 and the capacitors C2. Meanwhile, the switches FZ are also ON, so that the voltages (Voutp and Voutn) at the two output ends of the operating amplifier are equal.

Within a first data holding period (designated as H1 in FIG. 2), the switches F1 and FZ are OFF, but the switches F2 are ON, so that data (that is, the first group of analog input signals Vinp1 and Vinn1) stored in the capacitors C1 are outputted to the two output ends of the operating amplifier 131 via the capacitors CF, and are further transmitted to the back-stage analog digital conversion core 50. Meanwhile, a switch at the back stage of the analog digital conversion core 50 is switched so as to transmit the digital output signal DOUT1 of the first channel. Moreover, the switches F5 must be ON, so that data (that is, the second group of analog input signals Vinp2 and Vinn2) stored in the capacitors C2 is not affected. That is, after the first data holding period, the analog digital conversion circuit converts the first group of analog input signals Vinp1 and Vinn1 into the digital output signal DOUT1.

Within the second data holding period (designated as H2 in FIG. 2), the switches F1 and FZ are OFF, but the switches F4 are ON, so that data (that is, the second group of analog input signals Vinp2 and Vinn2) stored in the capacitors C2 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT2 of the second channel. Moreover, the switches F3 must be ON, so that the common voltage Vcom can be coupled to the capacitors C1. That is, after the second data holding period, the analog digital conversion circuit converts the second group of analog input signals Vinp2 and Vinn2 into the digital output signal DOUT2.

The above procedures S~H2 are repeated so as to sequentially transmit the analog input signal to the analog digital conversion core 50, which further converts the analog input signal into the digital output signal and then sequentially outputs the digital output signal.

Second Embodiment: 3 Channels

Figure 3:
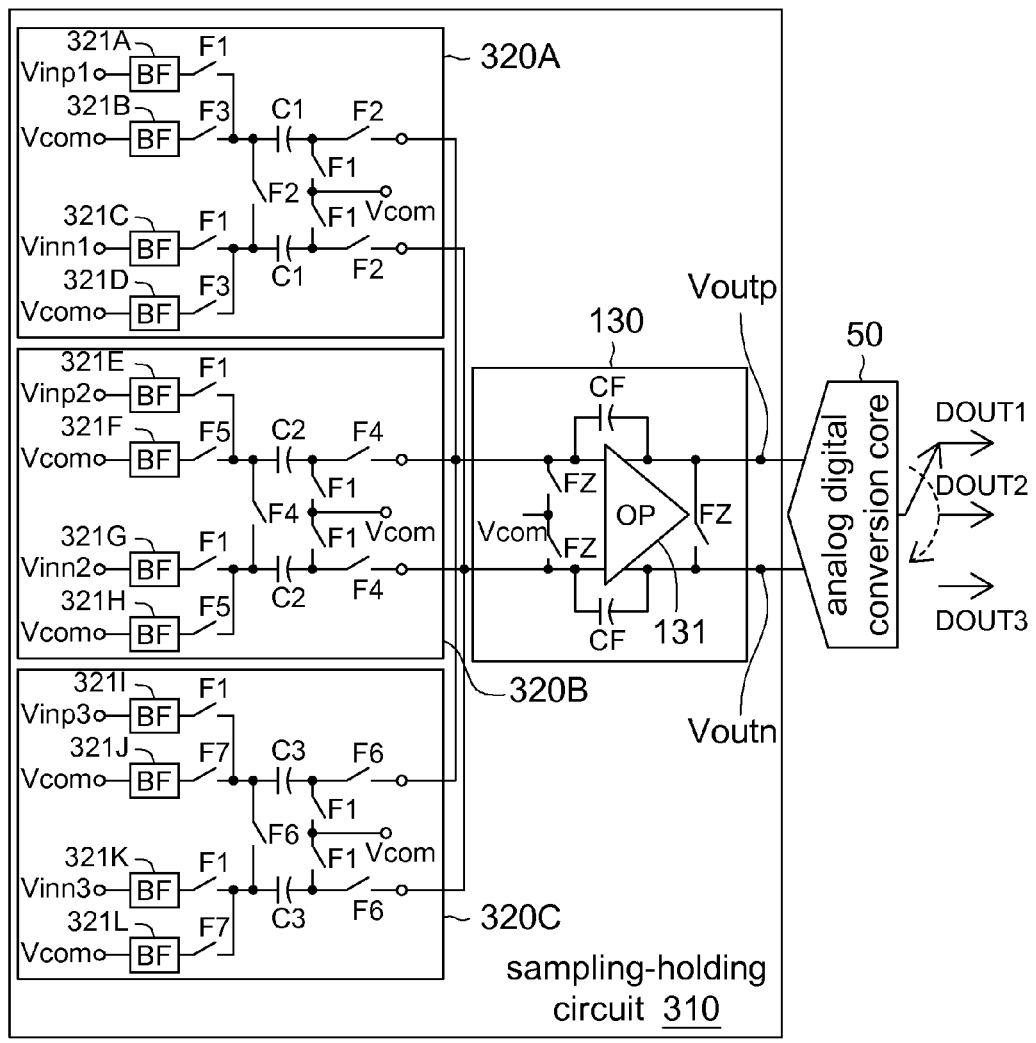
FIG. 3 shows an analog digital conversion circuit according to a second embodiment of the disclosure.
Figure 4:
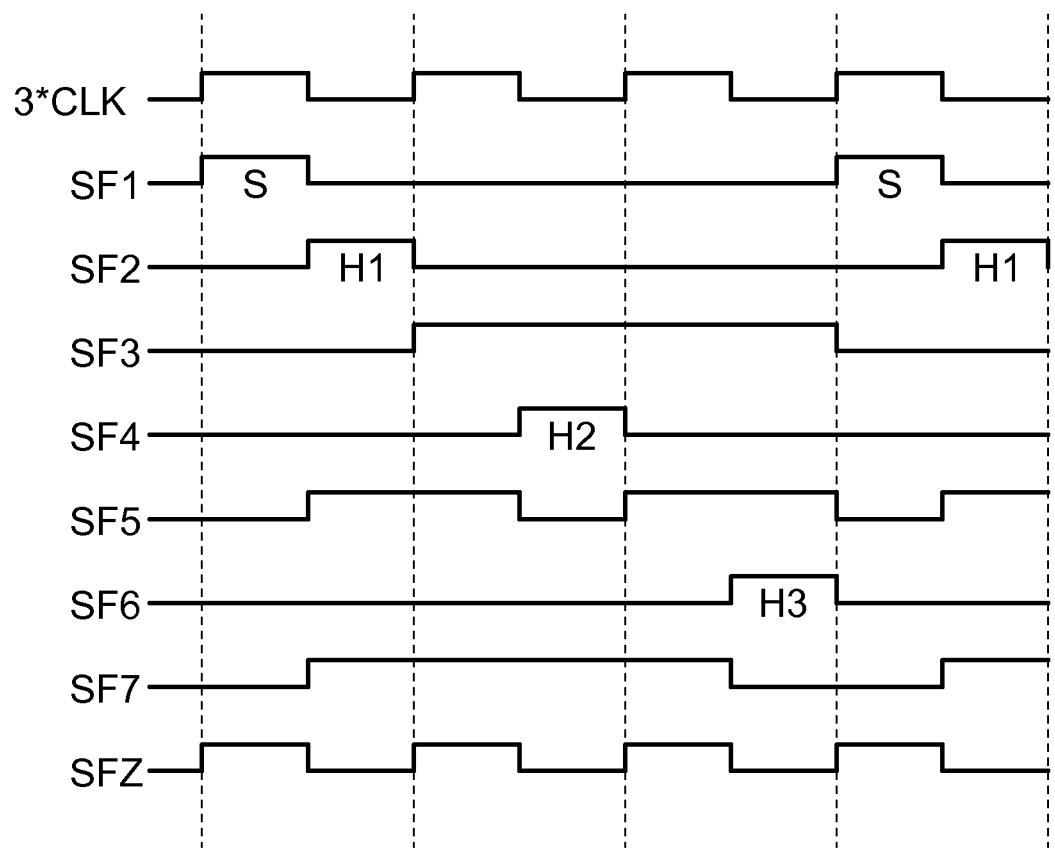
FIG. 4 shows a signal waveform of the analog digital conversion circuit according to the second embodiment of the disclosure.

FIG. 3 shows an analog digital conversion circuit according to a second embodiment of the disclosure. FIG. 4 shows a signal waveform of the analog digital conversion circuit according to the second embodiment of the disclosure. The analog digital conversion circuit of the second embodiment of the disclosure can be applied in 3 channels. That is, the analog digital conversion circuit of the second embodiment of the disclosure can receive and convert 3 groups of analog input signals into 3 digital output signals.

As indicated in FIG. 3, the analog digital conversion circuit 300 of the second embodiment of the disclosure includes a sampling-holding circuit 310 and an analog digital conversion core 50. The sampling-holding circuit 310 includes multiple sampling circuits 320A, 320B and 320C and an output circuit 130.

The sampling circuit 320A includes a plurality of buffer circuits 321A~321D, multiple switches F1, multiple switches F2, multiple switches F3 and multiple capacitors C1. The sampling circuit 320B includes a plurality of buffer circuit 321E~321H, multiple switches F1, multiple switches F4, multiple switches F5 and multiple capacitors C2. The sampling circuit 320C includes a plurality of buffer circuit 321I~321L, multiple switches F1, multiple switches F6, multiple switches F7 and multiple capacitors C3. In the second embodiment, the architecture of the sampling circuit 320A~320C is the same as or similar to that of the sampling circuits 120A and 120B of the first embodiment, and the similarities are not repeated here.

Referring to both FIG. 3 and FIG. 4, the principles of operation of the second embodiment of the disclosure are disclosed. The operating clock 3*CLK will be inputted to the buffer circuits 321A~321L, the operating amplifier 131 of the output circuit 130 and the analog digital conversion core 50, which are all inside the analog digital conversion circuit 300. The control signals SF1, SF2, SF3, SF4, SF5, SF6, SF7 and SFZ in FIG. 4 respectively control the switches F1, F2, F3, F4, F5, F6, F7 and FZ.

Within the sampling period (designated as S in FIG. 4), the switches F1 are ON, so that the 3 groups of analog input signals buffered in the buffer circuits 321A, 321C, 321E, 321G, 321I and 321K respectively charge the capacitors C1, the capacitors C2 and the capacitors C3. Meanwhile, the switches FZ are also ON, so that the voltages (Voutp and Voutn) at the two output ends of the operating amplifier are equal.

Within the first data holding period (designated as H1 in FIG. 4), the switches F1 and FZ are OFF, but the switches F2 are ON, so that data (that is, the first group of analog input signals Vinp1 and Vinn1) stored in the capacitors C1 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT1 of the first channel. Moreover, the switches F5 and F7 must be ON, so that data (that is, the second group of analog input signals Vinp2 and Vinn2, and the third group of analog input signals Vinp3 and Vinn3) stored in the capacitors C2 and the capacitors C3 is not affected. That is, after the first data holding period, the analog digital conversion circuit converts the first group of analog input signals Vinp1 and Vinn1 into the digital output signal DOUT1.

Within the second data holding period (designated as H2 in FIG. 4), the switches F1 and FZ are OFF, but the switches F4 are ON, so that data (that is, the second group of analog input signals Vinp2 and Vinn2) stored in the capacitors C2 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT2 of the second channel. Meanwhile, the switches F3 must be ON, so that the common voltage Vcom can be coupled to the capacitors C1. Moreover, the switches F7 must be ON, so that data (that is, the third group of analog input signals Vinp3 and Vinn3) stored in the capacitors C3 is not affected. That is, after the second data holding period, the analog digital conversion circuit converts the second group of analog input signals Vinp2 and Vinn2 into the digital output signal DOUT2.

Within the third data holding period (designated as H3 in FIG. 4), the switches F1 and FZ are OFF, but the switches F6 are ON, so that data (that is, the third group of analog input signals Vinp3 and Vinn3) stored in the capacitors C3 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT3 of the third channel. Moreover, the switches F3 and F5 must be ON, so that the common voltage Vcom can be coupled to the capacitors C1 and the capacitors C2. That is, after the third data holding period, the analog digital conversion circuit converts the third group of analog input signals Vinp3 and Vinn3 into the digital output signal DOUT3.

The above procedures (S~H3) are repeated so as to sequentially transmit the analog input signal to the analog digital conversion core 50, which further converts the analog input signal into the digital output signal and then sequentially outputs the digital output signal.

Third Embodiment: 4 Channels

Figure 5:
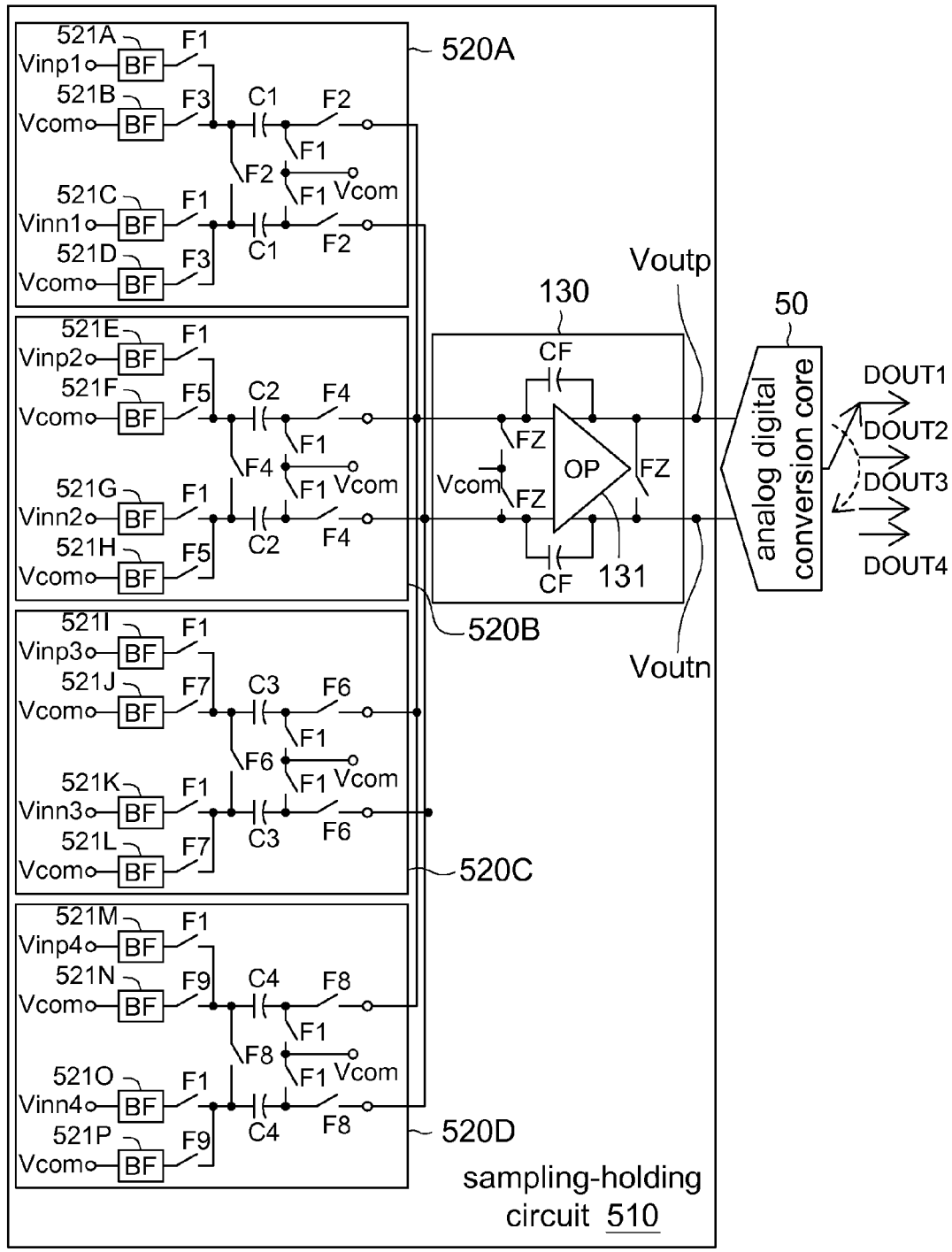
FIG. 5 shows an analog digital conversion circuit according to a third embodiment of the disclosure.
Figure 6:
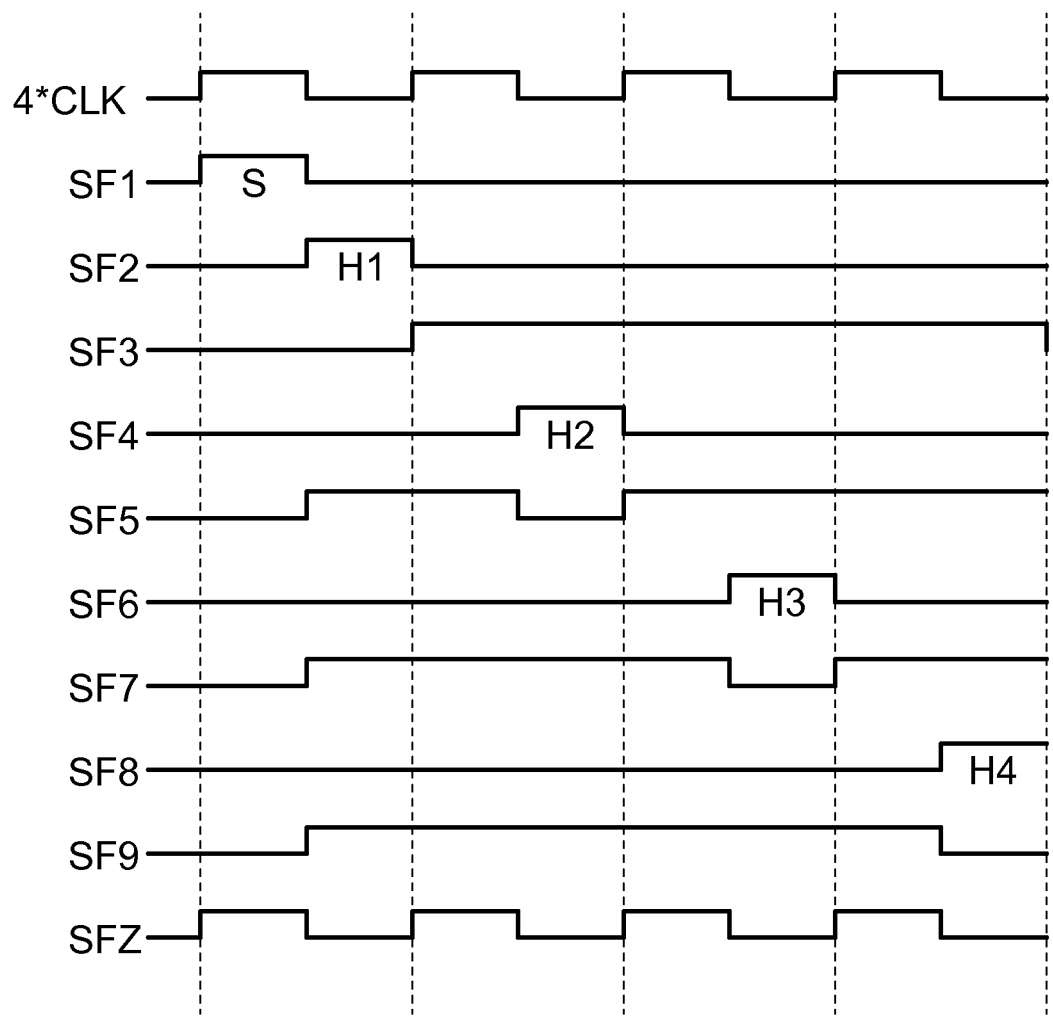
FIG. 6 shows a signal waveform of the analog digital conversion circuit according to the third embodiment of the disclosure.

FIG. 5 shows an analog digital conversion circuit according to a third embodiment of the disclosure. FIG. 6 shows a signal waveform of the analog digital conversion circuit according to the third embodiment of the disclosure. The analog digital conversion circuit of the third embodiment of the disclosure can be applied in 4 channels. That is, the analog digital conversion circuit of the third embodiment of the disclosure can receive and convert 4 groups of analog input signals into 4 digital output signals.

As indicated in FIG. 5, the analog digital conversion circuit 500 of the third embodiment of the disclosure includes a sampling-holding circuit 510 and an analog digital conversion core 50. The sampling-holding circuit 510 includes multiple sampling circuits 520A, 520B, 520C and 520D, and an output circuit 130.

The sampling circuits 520A includes a plurality of buffer circuits 521A~521D, multiple switches F1, multiple switches F2, multiple switches F3 and multiple capacitors C1. The sampling circuits 520B includes a plurality of buffer circuits 521E~521H, multiple switches F1, multiple switches F4, multiple switches F5 and multiple capacitors C2. The sampling circuits 520C includes a plurality of buffer circuits 521I~521L, multiple switches F1, multiple switches F6, multiple switches F7 and multiple capacitors C3. The sampling circuits 520D includes a plurality of buffer circuits 521M~521P, multiple switches F1, multiple switches F8, multiple switches F9 and multiple capacitors C4. In the third embodiment, the architecture of the sampling circuits 520A~520D is the same as or similar to the sampling circuits 120A~120B of the first embodiment, and the similarities are not repeated here.

Referring to both FIG. 5 and FIG. 6, the principles of operation of the third embodiment of the disclosure are disclosed. The operating clock 4*CLK will be inputted to the buffer circuits 521A~521P, the operating amplifier 131 of the output circuit 130 and the analog digital conversion core 50, which are all inside the analog digital conversion circuit 500. The control signals SF1, SF2, SF3, SF4, SF5, SF6, SF7, SF8, SF9 and SFZ of FIG. 6 respectively control the switches F1, F2, F3, F4, F5, F6, F7, F8, F9 and FZ.

Within the sampling period (designated as S in FIG. 6), the switches F1 are ON, so that the 4 groups of analog input signals buffered in the buffer circuits 521A, 521C, 521E, 521G, 521I, 521K, 521M and 521O respectively charge the capacitors C1, the capacitors C2, the capacitors C3 and the capacitors C4. Meanwhile, the switches FZ are also ON, so that the voltages (Voutp and Voutn) at the two output ends of the operating amplifier are equal.

Within the first data holding period (designated as H1 in FIG. 6), the switches F1 and FZ are OFF, but the switches F2 are ON, so that data (that is, the first group of analog input signals Vinp1 and Vinn1) stored in the capacitors C1 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT1 of the first channel. Moreover, the switches F5, F7 and F9 must be ON, so that data (that is, the second group of analog input signals Vinp2 and Vinn2, the third group of analog input signals Vinp3 and Vinn3, and the fourth group of analog input signals Vinp4 and Vinn4) stored in the capacitors C2, the capacitors C3 and the capacitors C4 is not affected. That is, after the first data holding period, the analog digital conversion circuit converts the first group of analog input signals Vinp1 and Vinn1 into the digital output signal DOUT1.

Within the second data holding period (designated as H2 in FIG. 6), the switches F1 and FZ are OFF, but the switches F4 are ON, so that data (that is, the second group of analog input signals Vinp2 and Vinn2) stored in the capacitors C2 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT2 of the second channel. Meanwhile, the switches F3 must be ON, so that the common voltage Vcom can be coupled to the capacitors C1. Moreover, the switches F7 and F9 must be ON, so that data (that is, the third group of analog input signals Vinp3 and Vinn3, and the fourth group of analog input signals Vinp4 and Vinn4) stored in the capacitors C3 and the capacitors C4 is not affected. That is, after the second data holding period, the analog digital conversion circuit converts the second group of analog input signals Vinp2 and Vinn2 into the digital output signal DOUT2.

Within the third data holding period (designated as H3 in FIG. 6), the switches F1 and FZ are OFF, but the switches F6 are ON, so that data (that is, the third group of analog input signals Vinp3 and Vinn3) stored in the capacitors C3 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT3 of the third channel. Meanwhile, the switches F3 and F5 must be ON, so that the common voltage Vcom can be coupled to the capacitors C1 and the capacitors C2. Moreover, the switches F9 must be ON, so that data (that is, the fourth group of analog input signals Vinp4 and Vinn4) stored in the capacitors C4 is not affected. That is, after the third data holding period, the analog digital conversion circuit converts the third group of analog input signals Vinp3 and Vinn3 into the digital output signal DOUT3.

Within the fourth data holding period (designated as H4 in FIG. 6), the switches F1 and FZ are OFF, but the switches F8 are ON, so that data (that is, the fourth group of analog input signals Vinp4 and Vinn4) stored in the capacitors C4 are outputted to the two output ends of the operating amplifier 131 via the capacitors CF, and are further transmitted to the back-stage analog digital conversion core 50. Meanwhile, the switch at the back stage of the analog digital conversion core 50 is switched so as to transmit the digital output signal DOUT4 of the fourth channel. Moreover, the switches F3, F5 and F7 must be ON, so that the common voltage Vcom can be coupled to the capacitors C1, the capacitors C2 and the capacitors C3. That is, after the fourth data holding period, the analog digital conversion circuit converts the fourth group of analog input signals Vinp4 and Vinn4 into the digital output signal DOUT4.

The above procedures (S~H4) are repeated so as to sequentially transmit the analog input signal to the analog digital conversion core 50, which further converts the analog input signal into the digital output signal and then sequentially outputs the digital output signal.

According to the above disclosure, anyone who is skilled in the technology of the disclosure will understand that the disclosure further can be applied in other possible embodiments with more channels and is still within the spirit of the disclosure. For example, as the frequency of the operating clock becomes higher, the analog digital conversion circuit of the above or other embodiments of the disclosure can be applied in more channels.

When the analog digital conversion circuit of the above embodiments of the disclosure is used in multi-channels, the back-stage output circuit and the analog digital conversion core can be shared, so that the circuit area is smaller, the circuit cost is reduced, and product competitiveness is enhanced. For example, when the analog digital conversion circuit of the above embodiments of the disclosure is used in N channels, the circuit area is merely 1/N of the circuit area of the conventional analog digital conversion circuit.

As long as the operating clock N*CLK is high enough, the analog digital conversion circuit of the above or other embodiments of the disclosure can have high resolution level and low side effect.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A multi-channel analog digital conversion circuit, comprising:
   a plurality of sampling circuits for sampling and buffering a plurality of groups of analog input signals;
   a single output circuit coupled to the sampling circuits and shared by the sampling circuits; and
   a single analog digital conversion core coupled to the output circuit and shared by the sampling circuits;
   wherein,
   the sampling circuits at least comprises a first sampling circuit and a second sampling circuit, the first sampling circuit comprises a plurality of first buffer circuit sets, a first switch set and a first capacitor set, the first sampling circuit sampling and buffering a first group of the analog input signals, and the second sampling circuit comprises a plurality of second buffer circuit sets, a second switch set and a second capacitor set, the second sampling circuit sampling and buffering a second group of the analog input signals; and
   the output circuit comprises an operating amplifier, an output switch set and an output capacitor set.

2. The analog digital conversion circuit according to claim 1, wherein,
within a sampling period,
the first group and the second group of the analog input signals buffered in the first and the second buffer circuit set are respectively stored to the first and the second capacitor set according to an ON/OFF status of the first switch set and the second switch set; and
two output voltages of the two output ends of the operating amplifier are equal according to an ON/OFF status of the output switch set of the output circuit;
within a first data holding period,
the first group of the analog input signals stored in the first capacitor set is output to the two output ends of the operating amplifier via the output capacitor set, and further transmitted to the analog digital conversion core; and
the ON/OFF status of the second switch set is controlled, so that the second group of the analog input signals stored in the second capacitor set is not affected; and
within a second data holding period,
the second group of the analog input signals stored in the second capacitor set is output to the two output ends of the operating amplifier via the output capacitor set, and further transmitted to the analog digital conversion core; and
the ON/OFF status of the first switch set is controlled, so that a common voltage is coupled to the first capacitor set.

3. The analog digital conversion circuit according to claim 1, wherein, the sampling circuits further comprises a third sampling circuit,
the third sampling circuit comprises a plurality of third buffer circuit sets, a third switch set and a third capacitor set, the third sampling circuit sampling and buffering a third group of the analog input signals.

4. The analog digital conversion circuit according to claim 3, wherein,
within a sampling period,
the first group, the second group and the third group of the analog input signals buffered in the first buffer circuit set, the second buffer circuit set and the third buffer circuit set are stored to the first, the second and the third capacitor set according to an ON/OFF status of the first, the second and the third switch set; and
two output voltages of the two output ends of the operating amplifier are equal according to an ON/OFF status of the output switch set of the output circuit;
within a first data holding period,
the first group of the analog input signals stored in the first capacitor set is output to the two output ends of the operating amplifier via the output capacitor set, and further transmitted to the analog digital conversion core;
the ON/OFF status of the second and the third switch set is controlled, so that the second and the third group of the analog input signals stored in the second and the third capacitor set are not affected; and
within a second data holding period,
the second group of analog input signals stored in the second capacitor set is output to the two output ends of the operating amplifier via the output capacitor set, and further transmitted to the analog digital conversion core;
the ON/OFF status of the third switch set is controlled, so that the third group of the analog input signals stored in the third capacitor set is not affected; and
the ON/OFF status of the first switch set is controlled, so that a common voltage is coupled to the first capacitor set; and
within a third data holding period,
the third group of the analog input signals stored in the third capacitor set is output to the two output ends of the operating amplifier via the output capacitor set, and further transmitted to the analog digital conversion core; and
the ON/OFF status of the first and the second switch set is controlled, so that the common voltage is coupled to the first and the second capacitor set.

5. The analog digital conversion circuit according to claim 3, wherein, the sampling circuits further comprises a fourth sampling circuit,
the fourth sampling circuit comprises a plurality of fourth buffer circuit sets, a fourth switch set and a fourth the capacitor set, the fourth sampling circuit sampling and buffering a fourth group of the analog input signals.

6. The analog digital conversion circuit according to claim 5, wherein,
within a sampling period,
the first group, the second group, the third group and the fourth group of the analog input signals buffered in the first, the second, the third and the fourth buffer circuit set are stored to the first, the second, the third and the fourth the capacitor set according to an ON/OFF status of the first, the second, the third and the fourth switch set; and
two output voltages of the two output ends of the operating amplifier are equal according to an ON/OFF status of the output switch set of the output circuit;
within a first data holding period;
the first group of the analog input signals stored in the first capacitor set is output to the two output ends of the operating amplifier via the output capacitor set, and further transmitted to the analog digital conversion core;
the ON/OFF status of the second, the third and the fourth switch set is controlled, so that the second group, the third group and the fourth group of the analog input signals stored in the second, the third and the fourth the capacitor set are not affected; and
within a second data holding period,
the second group of the analog input signals stored in the second capacitor set is output to the two output ends of the operating amplifier via the output capacitor set, and further transmitted to the analog digital conversion core;
the ON/OFF status of the third and the fourth switch set is controlled, so that the third group and the fourth group of the analog input signals stored in the third and the fourth capacitor set are not affected; and
the ON/OFF status of the first switch set is controlled, so that a common voltage is coupled to the first capacitor set; and
within a third data holding period,
the third group of the analog input signals stored in the third capacitor set is output to the two output ends of the operating amplifier via the output capacitor set, and further transmitted to the analog digital conversion core;
the ON/OFF status of the fourth switch set is controlled, so that the fourth group of the analog input signals stored in the fourth capacitor set are not affected; and
the ON/OFF status of the first and the second switch set is controlled, so that the common voltage is coupled to the first and the second capacitor set; and
within a fourth data holding period,
the fourth group of the analog input signals stored in the fourth capacitor set is output to the two output ends of the operating amplifier via the output capacitor set, and further transmitted to the analog digital conversion core; and the ON/OFF status of the first, the second and the third switch set is controlled, so that the common voltage is coupled to the first, the second and the third capacitor set.

7. A multi-channel analog digital conversion circuit, comprising:
a plurality of sampling circuits for sampling and buffering a plurality groups of analog input signals;
a single output circuit coupled to the sampling circuits and shared by the sampling circuits; and
a single analog digital conversion core coupled to the output circuit and shared by the sampling circuits,
wherein, the sampling circuits sequentially transmits the sampled groups of the analog input signals to the output circuit, the output circuit sequentially transmits the groups of the analog input signals to the analog digital conversion core and the analog digital conversion core sequentially converts the groups of the analog input signals into a plurality of digital output signals;
wherein the sampling circuits comprise a first sampling circuit and a second sampling circuit, the first sampling circuit comprises a plurality of first buffer circuit sets, a first switch set and a first capacitor set, the first sampling circuit sampling and buffering a first group of the analog input signals, and the second sampling circuit comprises a plurality of second buffer circuit sets, a second switch set and a second capacitor set, the second sampling circuit sampling and buffering a second group of the analog input signals; and
wherein the output circuit comprises an operating amplifier, an output switch set and an output capacitor set.

8. The analog digital conversion circuit according to claim 7, wherein,
within a sampling period, the sampling circuits concurrently sample and buffer the groups of the analog input signals; and
within a data holding period,
the sampling circuits sequentially transmit the sampled groups of the analog input signals to the output circuit;
the corresponding group of the analog input signals buffered in the corresponding sampling circuit but not transmitted yet is not affected; and
a common voltage is coupled to one of the sampling circuits, which has sent out the group of the analog input signals.

9. An analog digital conversion method for in a multi-channel analog digital conversion circuit, comprising:
concurrently sampling and buffering a plurality groups of analog input signals by a plurality of sampling circuits;
sequentially performing analog digital conversion to the sampled groups of the analog input signals to sequentially output a plurality of digital output signals;
avoiding affecting the sampled-but-unconverted group of the analog input signals; and
coupling a common voltage to the converted group of the analog input signals,
wherein the sampling circuits comprise a first sampling circuit and a second sampling circuit, the first sampling circuit comprises a plurality of first buffer circuit sets, a first switch set and a first capacitor set, the first sampling circuit sampling and buffering a first group of the analog input signals, and the second sampling circuit comprises a plurality of second buffer circuit sets, a second switch set and a second capacitor set, the second sampling circuit sampling and buffering a second group of the analog input signals.

* * * * *